US010719655B2

(12) United States Patent
Leu

(10) Patent No.: US 10,719,655 B2
(45) Date of Patent: Jul. 21, 2020

(54) METHOD AND SYSTEM FOR QUICKLY DIAGNOSING, CLASSIFYING, AND SAMPLING IN-LINE DEFECTS BASED ON CAA PRE-DIAGNOSIS DATABASE

(71) Applicant: ELITE SEMICONDUCTOR, INC., Hsinchu County (TW)

(72) Inventor: Iyun Leu, Hsinchu (TW)

(73) Assignee: ELITE SEMICONDUCTOR, INC., Hsinchu County (TW)

( * ) Notice: Subject to any disclaimer, the term of this patent is extended or adjusted under 35 U.S.C. 154(b) by 0 days.

(21) Appl. No.: 16/040,598

(22) Filed: Jul. 20, 2018

(65) Prior Publication Data

US 2019/0026419 A1    Jan. 24, 2019

(30) Foreign Application Priority Data

Jul. 21, 2017    (TW) .............................. 106124558 A

(51) Int. Cl.
*G06F 17/50* (2006.01)
*G06F 30/398* (2020.01)

(52) U.S. Cl.
CPC ................................ *G06F 30/398* (2020.01)

(58) Field of Classification Search
CPC ..... G06F 17/5081; H01L 22/20; H01L 22/12; H01L 21/67271
USPC ........................................... 716/56, 112, 136
See application file for complete search history.

(56) References Cited

U.S. PATENT DOCUMENTS

| 5,598,341 A * | 1/1997 | Ling | ................. | G01N 21/9501 |
| | | | | 257/E21.525 |
| 2004/0254752 A1* | 12/2004 | Wisniewski | ............ | H01L 22/20 |
| | | | | 702/84 |
| 2008/0250361 A1* | 10/2008 | Bae | .......................... | G03F 1/72 |
| | | | | 716/132 |

* cited by examiner

*Primary Examiner* — Nghia M Doan
(74) *Attorney, Agent, or Firm* — Li & Cai Intellectual Property (USA) Office

(57) ABSTRACT

The present disclosure provides a system and a method for quickly diagnosing, classifying, and sampling in-line defects based on a CAA pre-diagnosis database. The method includes the steps of obtaining a design layout of an object and a defect data of an important process stage of the object, obtaining a pre-diagnosis data group related to the design layout from a CAA pre-diagnosing database, and judging a killer defect index and a failure risk level of the defect data according to the pre-diagnosis data group.

8 Claims, 6 Drawing Sheets

| No. | CAA pre-diagnosis data group ||||
| | position coordinate (x,y) | defect size (nm) | defect shape (aspect ratio) | CAA based KDI value |
| --- | --- | --- | --- | --- |
| 1 | $x_1, y_1$ | 100 | 1.3 | 0 |
| 2 | $x_2, y_2$ | 30 | 1.2 | 0.5 |
| 3 | $x_3, y_3$ | 40 | 1.0 | 1.0 |
| ... | ... | ... | ... | ... |

FIG. 6

METHOD AND SYSTEM FOR QUICKLY DIAGNOSING, CLASSIFYING, AND SAMPLING IN-LINE DEFECTS BASED ON CAA PRE-DIAGNOSIS DATABASE

CROSS-REFERENCE TO RELATED PATENT APPLICATION

This application claims the benefit of priority to Taiwan Patent Application No. 106124558, filed on Jul. 21, 2017. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a method and a system for analyzing defects, and more particularly to a method and a system for quickly diagnosing, classifying, and sampling in-line defects based on a CAA pre-diagnosis database.

BACKGROUND OF THE DISCLOSURE

Nowadays wafer manufacture techniques are developed toward the trends of large wafer size, small chip size, and complicated process. For example, the geometry dimension shrinks from 90 nm to 7 nm, 5 nm, 3 nm, and below. The immersion lithography technique is introduced in the design stage of about 45 nm, the high-k metal gate structure is introduced in the design stage of about 28 nm, and the finFET structure is introduced in the design stage of about 14 nm. Before delivering manufactured wafers to the IC design house, it is very important to perform inspection processes on the manufactured wafers to detect potential defects that are likely to negatively affect the yield.

In the manufacturing stage, the fabrication plant generally increases the sensitivity of inspection apparatuses to avoid ignoring the potential defects that are likely to affect the yield. This also results in an increase of quantity of detected defects accompanied with dummy and nuisance defects. Subsequently, the fabrication plant further utilizes scanning electron microscopy (SEM) apparatuses to analyze and sample the detected defects, so as to find out the root cause of the problem and quickly solve the problem. However, the SEM apparatuses in the fabrication plant have a limited velocity per hour in processing defects. The conventional method is that the inspection apparatus randomly samples small quantities of defects (e.g., 100 defect counts) from the scanned defects (e.g., several thousand to several ten thousand defect counts) of each SEM apparatus for analysis. In this situation, the inspection apparatus has a sample rate within several percentage points, or even less than one percentage point. The potential defects that are likely to negatively affect the yield are unlikely to be found, especially in the circumstance that various apparatuses and processes work together.

Therefore, there is an urgent need for a quick and efficient method which can monitor systematic defects and random defects during the manufacturing process, so that the mass production time and the profit would not be negatively affected.

SUMMARY OF THE DISCLOSURE

In response to the above-referenced technical inadequacies, the present disclosure provides a method and a system for quickly diagnosing, classifying, and sampling in-line defects based on a CAA pre-diagnosis database. The method and the system can limit the defect sampling quantities in a relatively small quantity range and the sampled defects have a probability to negatively affect the yield, and can find out the potential defects that are likely to negatively affect the yield for analysis.

In one aspect, the present disclosure provides a method for quickly diagnosing, classifying, and sampling in-line defects based on a CAA pre-diagnosis database including: obtaining a plurality of defect data of a process stage of an object, wherein each defect data includes a defect size and a defect coordinate of the corresponding in-line defect; obtaining a CAA pre-diagnosis data group related to a design layout from the CAA pre-diagnosing database, wherein the CAA pre-diagnosis data group includes a plurality of position coordinates of the design layout and a plurality of killer defect indexes related to the in-line defects of a variety of size levels that are mapped to each of the position coordinates; and executing a coordinate conversion from the in-line defects to the design layout to judge a failure risk of each defect data according to the CAA pre-diagnosis data group, wherein the failure risk is determined by the killer defect index related to the position coordinate that is mapped to the defect coordinate of the corresponding in-line defect and the defect size of the corresponding in-line defect.

In one aspect, the present disclosure provides a system for quickly diagnosing, classifying, and sampling in-line defects based on a CAA pre-diagnosis database including a data receiving module and a defect diagnosing module. The data receiving module is configured for obtaining a plurality of defect data of a process stage of an object and a CAA pre-diagnosis data group related to a design layout from the CAA pre-diagnosing database, wherein each defect data includes a defect size and a defect coordinate of the corresponding in-line defect, the CAA pre-diagnosis data group includes a plurality of position coordinates of the design layout and a plurality of killer defect indexes related to the in-line defects of a variety of size levels that are mapped to each of the position coordinates. The defect diagnosing module is configured for executing a coordinate conversion from the in-line defects to the design layout to judge a failure risk of each defect data according to the CAA pre-diagnosis data group, wherein the failure risk is determined by the killer defect index related to the position coordinate that is mapped to the defect coordinate of the corresponding in-line defect and the defect size of the corresponding in-line defect.

The advantage of the present disclosure is that the method and the system for quickly diagnosing, classifying, and sampling in-line defects based on a CAA pre-diagnosis database obtains a CAA pre-diagnosis data group related to a design layout from the CAA pre-diagnosing database and judges a failure risk level of a defect data of a process stage of an object according to the CAA pre-diagnosis data group, thereby reviewing large quantities of defect data without negatively affecting the production time and selecting the defect data having a relatively high open or short probability for analysis so as to avoid ignoring the potential defects that are likely to negatively affect the yield. Compared to the prior art, the method can provide a quick and accurate result for finding out the critical killer defects, so as to make a yield improving decision.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which:

FIGS. 4 to 6 are schematic views showing a process of establishing a failure risk pre-diagnosis database.

DETAILED DESCRIPTION OF THE EXEMPLARY EMBODIMENTS

Figure 1:
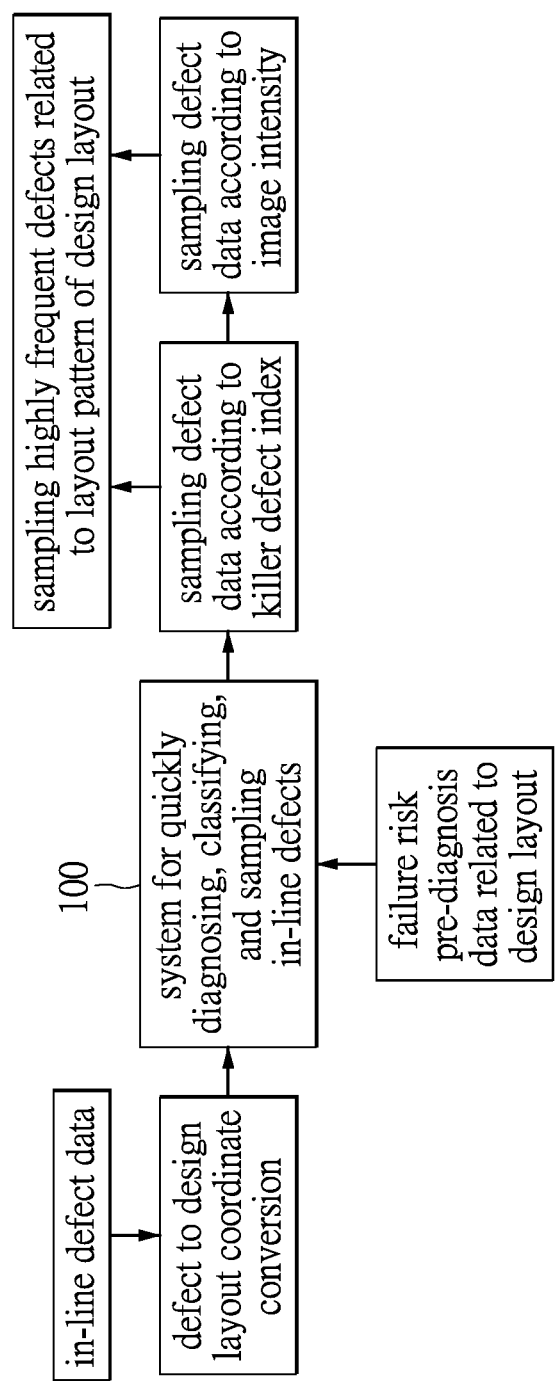
FIG. 1 is an implementation flowchart of a system for quickly diagnosing, classifying, and sampling in-line defects based on a CAA pre-diagnosis database of the present disclosure.

In the semiconductor industry, the design layout continuously shrinks in dimension to achieve higher performance and lower cost. For example, the geometry dimension shrinks from 90 nm to 65 nm, 45 nm, 28 nm, 14 nm, 10 nm, 7 nm, and below. Defects, that negatively affect the yield, also become smaller in size and would cause an open failure on a layout pattern having a smaller linewidth or a short failure on a layout pattern having a smaller spacing. It is more difficult to detect tiny defects on a wafer with complex patterns and in a small geometry technology process by the defect scan and inspection apparatus. For solving such problem, the defect inspection apparatus have to increase the sensitivity of programs thereof to catch all critical defects (DOI, defect of interest), but in practice, the quantity of the total detected defect counts would be increased accompanied with large quantities of nuisance defects (i.e., non-critical defects) that do not negatively affect the yield. Therefore, the present disclosure provides a method for quickly diagnosing, classifying, and sampling in-line defects based on a CAA pre-diagnosis database. The method introduces a CAA pre-diagnosing database of a circuit design layout that is established by mapping a pre-defined matrix defect data including a variety of defect sizes (ranging from a minimum defect size to a maximum defect size) and defect shapes (ranging from a minimum defect shape to a maximum defect shape) to all position coordinates of a full chip design at a design stage and judging a CAA value of each of the position coordinates over a matrix defect data including a predetermined defect size and shape. The CAA pre-diagnosing database can be used to quickly and accurately separate killer defects and non-killer defects from large quantities of in-line defects without negatively affecting the production time. Accordingly, the potential killer defects that may negatively affect the yield can be found and analyzed. For example, 100 critical defects can be found from several thousands to several ten thousand defects.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1. The method mainly includes: step S100, obtaining a design layout of an object and a defect data of a process stage of the object, wherein the defect data includes a defect size and a defect coordinate of an in-line defect; step S102, obtaining a CAA pre-diagnosis data group related to the design layout from a CAA pre-diagnosing database, wherein the CAA pre-diagnosis data group includes a plurality of position coordinates of the design layout and a plurality of killer defect indexes (i.e., CAA values) related to the in-line defects of a variety of size levels that are mapped to each of the position coordinates; and step S104, judging a failure risk of each defect data according to the CAA pre-diagnosis data group, wherein the failure risk is determined by the killer defect index related to the position coordinate that is mapped to the defect coordinate of the corresponding in-line defect and the defect size of the corresponding in-line defect.

Figure 2:
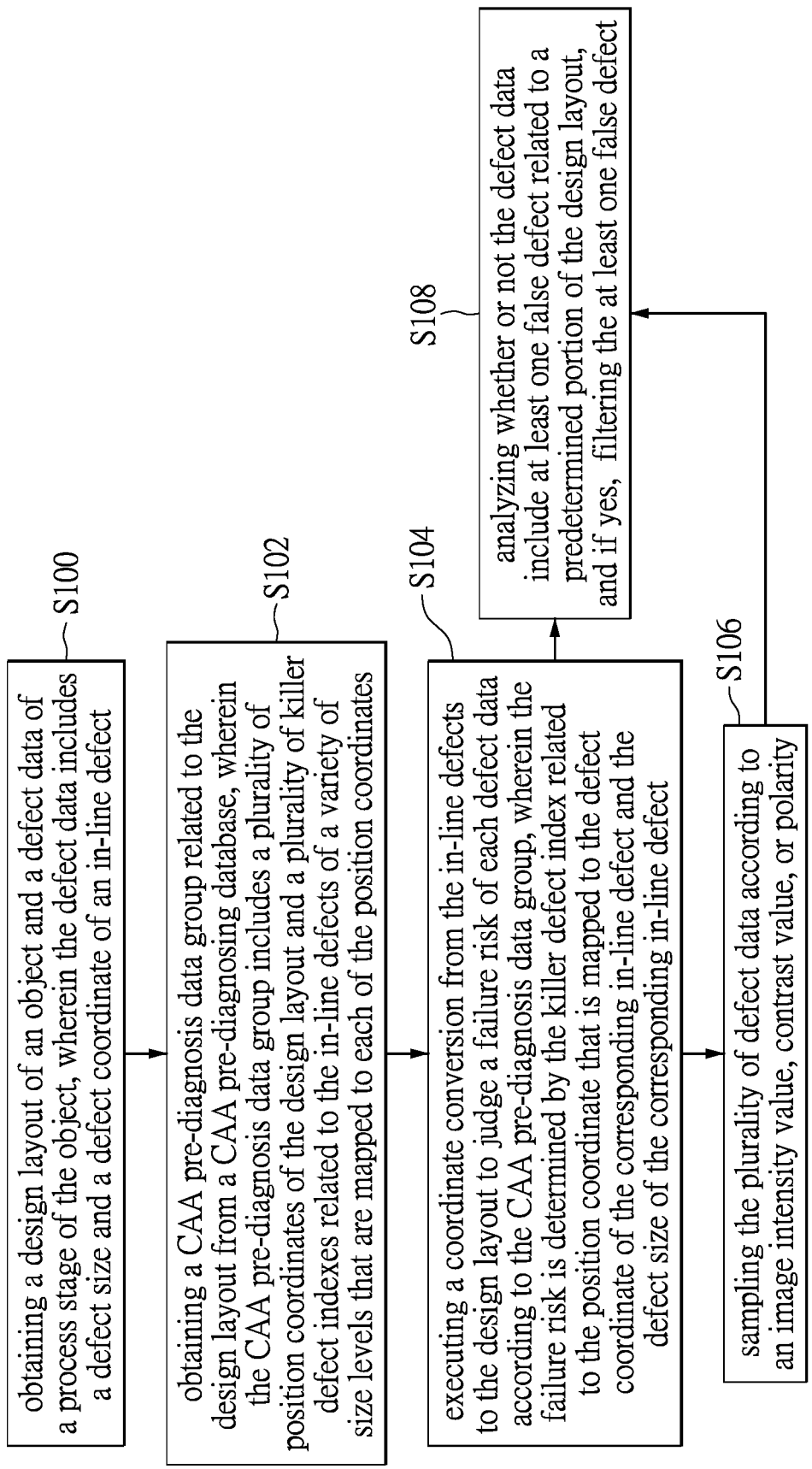
FIG. 2 is a flowchart showing steps of a method for quickly diagnosing, classifying, and sampling in-line defects based on a CAA pre-diagnosis database of the present disclosure.
Figure 3:
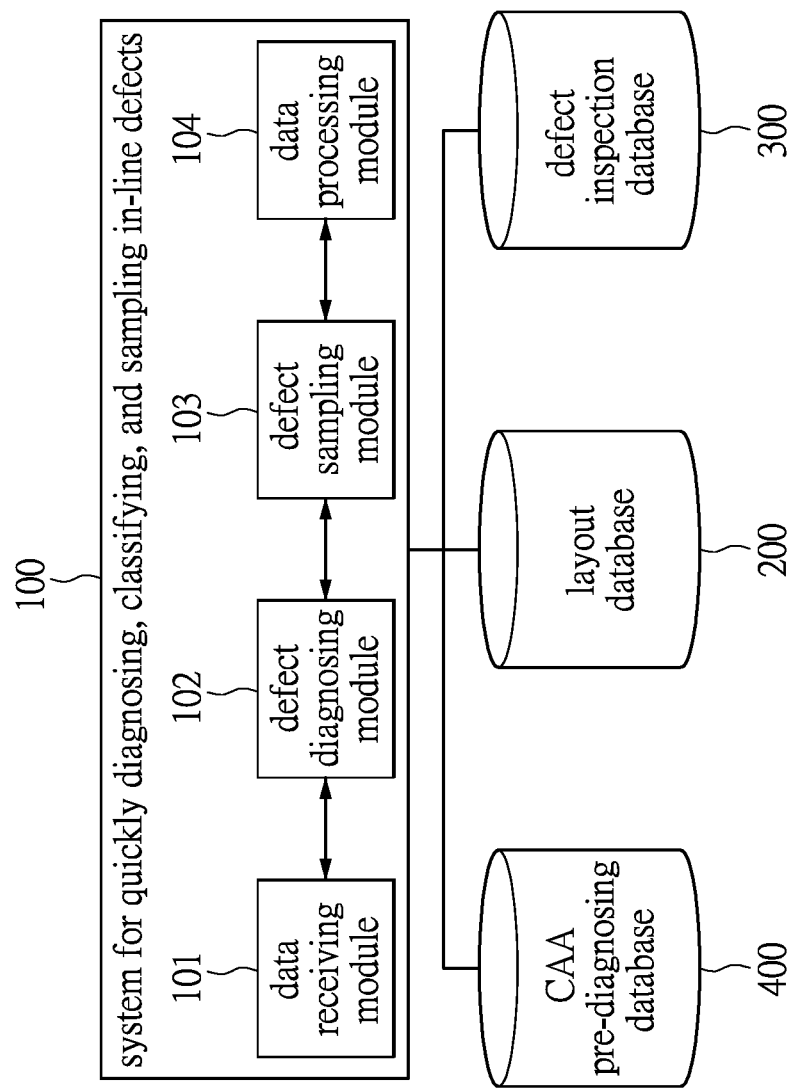
FIG. 3 is a functional block diagram of the system of the present disclosure.

In practice, users can obtain a killer defect index (i.e., a CAA value) by the process of mapping a defect to a design layout and performing a critical area analysis to analyze a critical area based on the defect size and a layout pattern of a corresponding layout region of the design layout, without using the CAA pre-diagnosing database. The related technical details are described in U.S. Pat. Nos. 8,473,223 and 8,312,401. Referring to FIGS. 2 and 3, the method can be performed automatically on a computer system by a software-implemented system 100 for quickly diagnosing, classifying, and sampling in-line defects. The method can be applied to a fabrication plant (e.g., a fab) or an IC design house to quickly and accurately filter nuisance defects from inspection defects of an important process stage (i.e., deposition, lithography or etching process) of an object (i.e., a wafer). Therefore, the fabrication plant or design house can immediately manage the yield loss of the object being manufactured and make a yield improving decision. Since the CAA values related to the coordinate locations of the full chips and the plurality of defect size/shape data are already obtained at the design stage, the CAA pre-diagnosis database can be established for processing in-line defect diagnosis data at a production stage.

In the present embodiment, a data receiving module 101 of the system 100 for quickly diagnosing, classifying, and sampling in-line defects is configured for obtaining a design layout of an object and a plurality of defect data (i.e., the step S100 of the method). The design layout includes preset circuit patterns of the object, and can be obtained from a layout database 200 that is established in a computer system. The plurality of defect data are produced on the object at a process stage and detected by a defect inspection apparatus in the fabrication plant. The plurality of defect data can be obtained from a defect inspection database 300 that is established in the computer system. Generally, the defect inspection apparatus can detect different locations of the object and produce a plurality of inspection images and provides a plurality of defect data of potential defects in each of the inspection images. Each defect data at least includes several tens to several thousands of information such as a defect size, a defect shape, a defect coordinate, an image intensity value, and a contrast value.

It should be noted that the plurality of defect data from the defect inspection apparatus may exist deviations, for example, a deviation of a detected size or shape from the actual size or shape, or an offset of a detected coordinate from the actual coordinate. If such defect data is used analyze the yield loss, the real reason of the yield loss would not be known. Therefore, a defect diagnosing module 102 of the system 100 for quickly diagnosing, classifying, and sampling in-line defects would correct the deviations of the plurality of defect data, i.e., perform a coordinate conversion and a coordinate offset correction.

After obtaining the design layout of an object and the plurality of defect data, the data receiving module 101 obtains a CAA pre-diagnosis data group related to the design layout from a CAA pre-diagnosing database 400 that is established in the computer system (i.e., the step S102 of the method). It should be noted that, the core technology of the present method is to analyze an open or short failure probability of each portion of the designed circuit layout pattern of the design layout caused by defects of a variety of size levels in advance. The related data would be stored in the CAA pre-diagnosing database 400 to serve as a basis for classifying and sampling the plurality of defect data. The CAA pre-diagnosing database 400 is established by mapping a pre-defined matrix defect data including a variety of defect sizes (ranging from a minimum defect size to a maximum defect size) and defect shapes (ranging from a minimum defect shape to a maximum defect shape) to all position coordinates of a full chip design at a design stage and judging a CAA value of each of the position coordinates over a matrix defect data of a predetermined defect size and shape.

The aforesaid analyzing method firstly can utilize an electronic design automation (EDA) tool or image processing method to design the defects of a variety of size levels, and map the defects to every position coordinate (x, y) of the design layout one-by-one in size order from smallest to largest to compare with every portion of the designed circuit layout pattern. Accordingly, a plurality of killer defect indexes (KDI), i.e., CAA values, related to the defects of a variety of size levels that are mapped to each of the position coordinates (including its offset range) can be obtained by a critical area analysis (CAA) process. The related technical details are described in U.S. Pat. No. 8,312,401. After repeating the aforesaid steps several times, a plurality of CAA pre-diagnosis data groups corresponding to different design layouts (e.g., design layouts of different layers of a wafer) can be established in the CAA pre-diagnosing database 400. Each of the CAA pre-diagnosis data groups includes the plurality of position coordinates of the corresponding design layout and the plurality of killer defect indexes related to the defects of a variety of size levels that are mapped to each of the position coordinates.

More specifically, the CAA based KDI value (i.e., CAA values) can be defined by the user to categorize the defects into different failure risk levels. For example, the KDI value has a minimum value of 0 and a maximum value of 1; when the KDI value is 1 or between 0.7 and 1, the open or short probability of the layout pattern is very high; when the KDI value is between 0.5 and 0.7, the open or short probability of the layout pattern is relatively high; when the KDI value is between 0.1 and 0.5, the open or short probability of the layout pattern is relatively low; when the KDI value is less than 0.1, the open or short probability of the layout pattern is very low. That is to say, the defect having a KDI value of 1 or between 0.7 and 1 is judged as a high risk killer defect; the defect having a KDI value between 0.5 and 0.7 is judged as a medium risk killer defect; the defect having a KDI value between 0.1 and 0.5 is judged as a low risk killer defect; the defect having a KDI value less than 0.1 is judged as a negligible risk killer defect; the defect having a KDI value of 0 is judged as a dummy defect or nuisance defect. In practice, the defect having a KDI value greater than 0.5 can be regarded as a critical defect, and the defect having a KDI value less than 0.5 can be regarded as a non-critical defect.

The KDI value of every risk level may be changed slightly due to a different fab, process technology, process layer, process step, or product. In practice, users can define a desired KDI value of every risk level according to open or short failure conditions shown in images.

Figure 4:
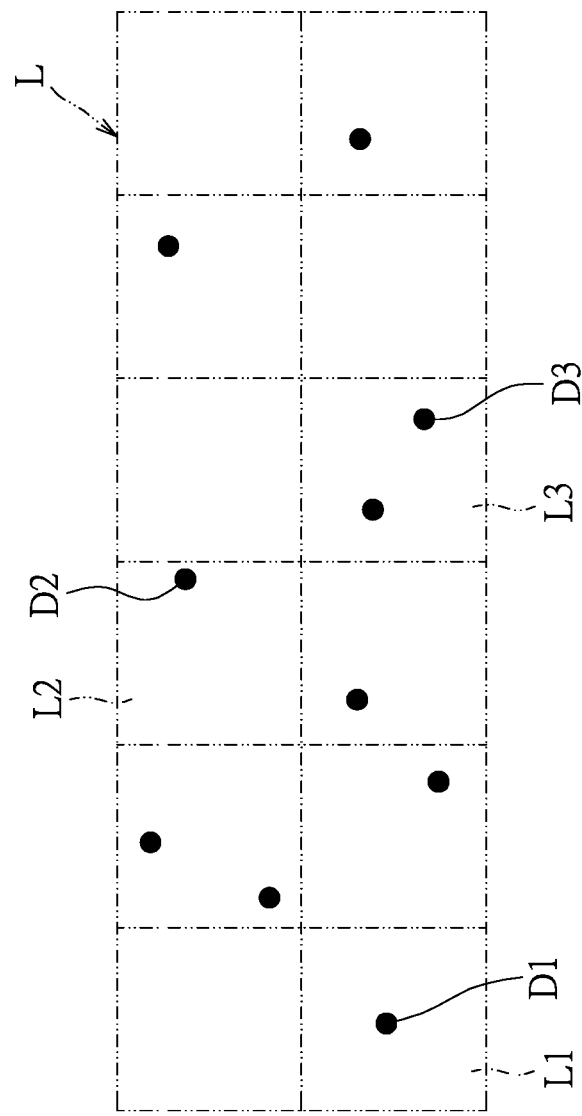
Figure 5:
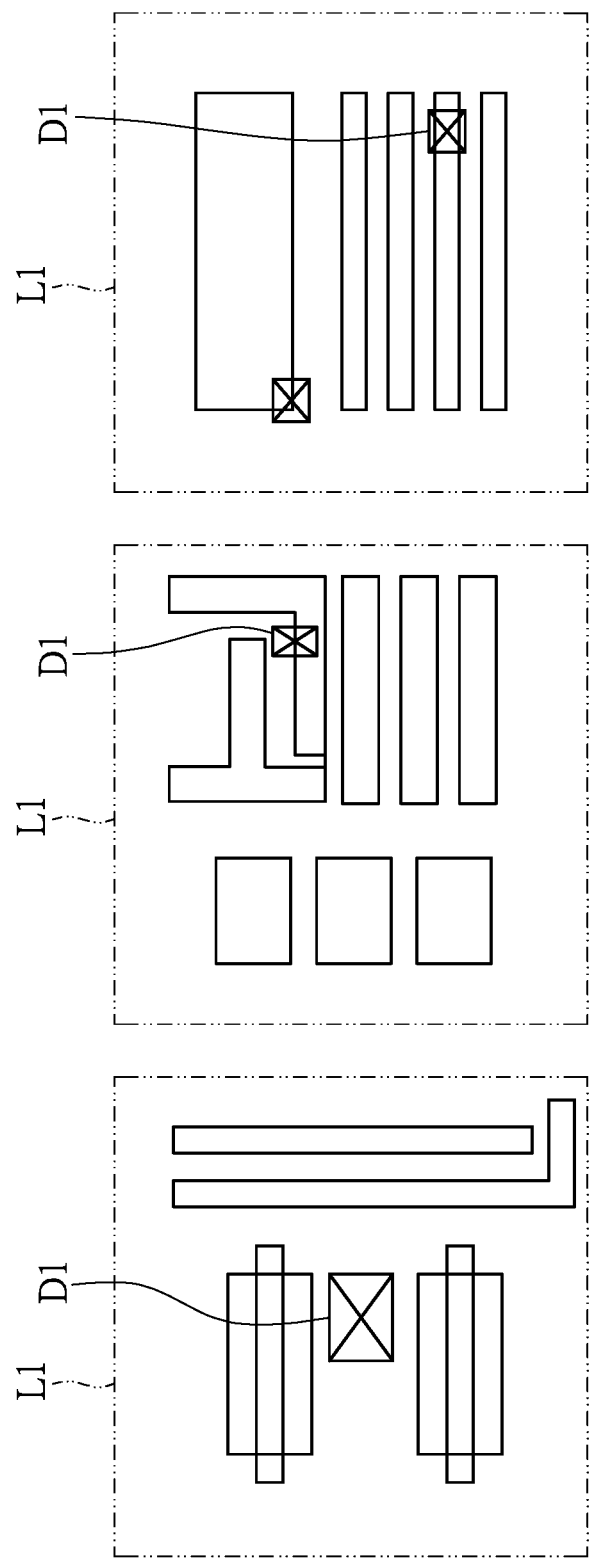

The following will describe how to establish a CAA pre-diagnosis data group of a design layout L of an object as shown in FIG. 4. An example as shown in FIGS. 5 and 6 showing the relationship among a plurality of defects of different size levels and a plurality of layout patterns of corresponding layout regions are further provided.

The design layout L is divided into a plurality of layout regions L1, L2, L3, and each of the layout regions L1, L2, L3 has a predetermined layout pattern therein. To simplify the description, FIG. 4 only shows the layout patterns in the layout regions L1, L2, L3. A defect D1 is produced for a position coordinate (x1, y1) of the layout region L1 in advance. A defect D2 is produced for a position coordinate (x2, y2) of the layout region L2 in advance. A defect D3 is produced for a position coordinate (x3, y3) of the layout region L3 in advance. Subsequently, CAA is performed to analyze the killer defect indexes of the defects D1-D3 respectively corresponding to the layout regions L1-L3. The defect D1 would not cause an open or short circuit failure of the layout pattern in the layout region L1, so that the CAA based killer defect index of 0 can be obtained. The defect D2 is likely to cause an open or short circuit failure of the layout pattern in the layout region L2, so that a CAA based killer defect index of 0.5 or higher can be obtained. The defect D3 would cause an open or short circuit failure of the layout pattern in the layout region L3, so that a CAA based killer defect index of 1 or close to 1 can be obtained.

After obtaining the CAA pre-diagnosis data group related to the design layout, the defect diagnosing module 102 categorizes the defect data into high failure risk, medium failure risk, low failure risk, negligible risk, or no failure risk (i.e., the step S104 of the method). The failure risk of the defect data is proportional to an open or short failure probability of a predetermined portion of the object, i.e. a sampling probability of a critical defect. It should be noted that, the defect diagnosing module 102 judges the risk level of the defect data via a data to data comparison (i.e., defect data to pre-diagnosis data). Each defect data is mapped to a correct position coordinate of the design layout. Subsequently, said defect data is judged as a corresponding risk level by a killer defect index related to the defect size that is mapped to the correct position coordinate. Therefore, although large quantities of defect data of the object are produced through different process stages, the defect data can be directly compared with the failure risk pre-diagnosing data so as to be categorized into different risk levels. That is to say, the present method can review the large quantities of defect data and select the defect data having a relatively high open or short probability for analysis, thereby avoid ignoring the potential defects that are likely to negatively affect the yield.

After categorizing the defect data into different failure risk levels, a defect sampling module 103 of the system 100 for quickly diagnosing, classifying, and sampling in-line defects can further sample the plurality of defect data of high failure risk or medium failure risk according to the image intensity value, the contrast value, or the polarity (i.e., the step S106 of the method). Accordingly, at least one critical defect data that substantially affect the yield can be found from the plurality of defect data. More specifically, the defect sampling module 103 can dynamically define a first threshold value and a second threshold value related to a parameter such as image intensity value or contrast value according to a distribution curve of the image intensity or contrast value and a quantity interval of the desired sampling and analyzing quantities. When the image intensity value or contrast value is greater than the first threshold value, the related defect data is judged as high sample priority. When the image intensity value or contrast value is between the first threshold value and the second threshold value, the related defect data is judged as medium sample priority. When the image intensity value or contrast value is less than the second threshold value, the related defect data is judged as low sample priority. In practice, user-defined first and second threshold values can be used for defect sampling. By the aforesaid sampling rule, the user can select the defect data of the high or medium priority for analysis, so as to increase the sampling accuracy of the critical defect data that is likely to cause an open or short failure.

After categorizing the defect data into different failure risk levels or sampling the defect data according to the image intensity value or contrast value, a data processing module 104 can analyze whether or not the defect data include at least one false defect related to a predetermined portion of the design layout, and if yes, the data processing module 104 filter the at least one false defect (i.e., the step S108 of the method). The defect that would only cause an open or short failure on the SEM image, but is unrelated to the circuit operation and the yield, is regarded as a false defect.

More specifically, the data processing module 104 can perform a statistical analysis within a time period to find out a plurality of frequent defects related to the design pattern. Subsequently, the frequent defects can be categorized into false defects and alarm defects that would affect the yield, thereby avoiding large quantities of false defects from negatively affecting the efficiency and accuracy of sampling the critical defect.

The advantage of the present disclosure is that the method and the system for quickly diagnosing, classifying, and sampling in-line defects based on a CAA pre-diagnosis database obtains a CAA pre-diagnosis data group related to a design layout from the CAA pre-diagnosing database and judges a failure risk level of a defect data of a process stage of an object according to CAA the pre-diagnosis data group, thereby reviewing large quantities of defect data without negatively affecting the production time and selecting the defect data having a relatively high open or short probability for analysis so as to avoid ignoring the potential defects that are likely to negatively affect the yield. Compared to the prior art, the method can provide a quick and accurate result for finding out the critical killer defects, so as to make a yield improving decision.

The method can utilize a defect data detected by a general inspection apparatus, for example, an image intensity and a contrast value, to limit the defect sampling quantities in a relatively small quantity, so as to increase the sampling efficiency of the critical defect data.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for quickly diagnosing, classifying, and sampling in-line defects based on a critical area analysis (CAA) pre-diagnosis database, comprising:

obtaining a plurality of defect data of a process stage of an object, wherein each defect data includes a defect size and a defect coordinate of the corresponding in-line defect;

obtaining a critical area analysis (CAA) pre-diagnosis data group related to a design layout from the CAA pre-diagnosing database, wherein the CAA pre-diagnosis data group includes a plurality of position coordinates of the design layout and a plurality of killer defect indexes related to the in-line defects of a variety of size levels that are mapped to each of the position coordinates; and executing a coordinate conversion from the in-line defects to the design layout to judge a failure risk of each defect data according to the CAA pre-diagnosis data group, wherein the failure risk is determined by the killer defect index related to the position coordinate that is mapped to the defect coordinate of the corresponding in-line defect and the defect size of the corresponding in-line defect;

wherein in the step of determining the failure risk of the defect data, the defect data is categorized as high failure risk, medium failure risk, low failure risk, negligible risk, or no failure risk; the failure risk of the defect data is proportional to an open or short failure probability of a predetermined portion of the object and a sampling probability of critical defects;

wherein the step of obtaining the plurality of defect data of the object further includes obtaining an inspection image of the process stage that includes a defect pattern of each of the in-line defects; each defect data includes an image intensity value and a contrast value of the corresponding in-line defect.

2. The method according to claim 1, further comprising sampling the plurality of defect data of high failure risk or medium failure risk according to the image intensity or contrast value of each of the in-line defects to find out at least one critical defect that negatively affects the yield of the object.

3. The method according to claim 2, wherein the plurality of defect data have a sampling priority that is determined by the image intensity or contrast value of each of the in-line defects.

4. The method according to claim 2, after the step of determining the failure risk of the plurality of the defect data or the step of sampling the plurality of defect data of high or medium failure risk, further comprising:
analyzing whether or not the plurality of defect data include at least one false defect; and
filtering the at least one false defect if the plurality of defect data include at least one false defect.

5. A system for quickly diagnosing, classifying, and sampling in-line defects based on a critical area analysis (CAA) pre-diagnosis database, comprising:
a data receiving module for obtaining a plurality of defect data of a process stage of an object and a critical area analysis (CAA) pre-diagnosis data group related to a design layout from the CAA pre-diagnosing database, wherein each defect data includes a defect size and a defect coordinate of the corresponding in-line defect, the CAA pre-diagnosis data group includes a plurality of position coordinates of the design layout and a plurality of killer defect indexes related to the in-line defects of a variety of size levels that are mapped to each of the position coordinates; and
a defect diagnosing module for executing a coordinate conversion from the in-line defects to the design layout to judge a failure risk of each defect data according to the CAA pre-diagnosis data group, wherein the failure risk is determined by the killer defect index related to the position coordinate that is mapped to the defect coordinate of the corresponding in-line defect and the defect size of the corresponding in-line defect;
wherein the defect diagnosing module categorizes the defect data into high failure risk, medium failure risk, low failure risk, negligible risk, or no failure risk; the failure risk of the defect data is proportional to an open or short failure probability of a predetermined portion of the object and a sampling probability of critical defects;
wherein the data receiving module further obtains an inspection image of the process stage that includes a defect pattern of each of the in-line defects; each defect data includes an image intensity value and a contrast value of the corresponding in-line defect.

6. The system according to claim 5, further comprising a defect sampling module for sampling the plurality of defect data of high failure risk or medium failure risk according to the image intensity or contrast value of each of the in-line defects to find out at least one critical defect that negatively affects the yield of the object.

7. The system according to claim 6, wherein defect sampling module determines a sampling priority for the plurality of defect data according to the image intensity or contrast value of each of the in-line defects.

8. The system according to claim 7, further comprising a data processing module for analyzing whether or not the plurality of defect data include at least one false defect and filtering the at least one false defect if the plurality of defect data include at least one false defect.

* * * * *